United States Patent
Waitl et al.

(10) Patent No.: US 7,675,132 B2
(45) Date of Patent: Mar. 9, 2010

(54) SURFACE MOUNTING OPTOELECTRONIC COMPONENT AND METHOD FOR PRODUCING SAME

(75) Inventors: Günter Waitl, Regensburg (DE); Robert Lutz, Bad Abbach (DE); Herbert Brunner, Sinzing (DE)

(73) Assignee: OSRAM GmbH, Munich (DE)

( * ) Notice: Subject to any disclaimer, the term of this patent is extended or adjusted under 35 U.S.C. 154(b) by 950 days.

(21) Appl. No.: 11/202,424

(22) Filed: Aug. 11, 2005

(65) Prior Publication Data

US 2006/0022212 A1  Feb. 2, 2006

Related U.S. Application Data

(60) Continuation of application No. 10/439,695, filed on May 16, 2003, now Pat. No. 6,946,714, which is a division of application No. 09/581,585, filed as application No. PCT/DE98/03676 on Dec. 15, 1998, now Pat. No. 6,610,563.

(30) Foreign Application Priority Data

Dec. 15, 1997   (DE)   ................. 197 55 734

(51) Int. Cl.
   *H01L 21/00*   (2006.01)
(52) U.S. Cl. .................. 257/434; 257/680; 257/99
(58) Field of Classification Search ................ 257/434, 257/680, 99
   See application file for complete search history.

(56) References Cited

U.S. PATENT DOCUMENTS

| | | | |
|---|---|---|---|
| 4,727,457 A | 2/1988 | Thillays | |
| 4,843,280 A | 6/1989 | Lumbard et al. | |
| 5,040,868 A | 8/1991 | Waitl et al. | |
| 5,043,716 A | 8/1991 | Latz et al. | 340/782 |
| 5,331,512 A | 7/1994 | Orton | |
| 5,347,605 A | 9/1994 | Isaksson | 385/92 |
| 5,545,359 A | 8/1996 | Axkley et al. | |
| 5,614,131 A | 3/1997 | Mukerji et al. | |
| 5,686,172 A | 11/1997 | Ohya et al. | |
| 5,985,696 A | 11/1999 | Brunner et al. | 438/116 |
| 6,052,500 A | 4/2000 | Takano et al. | |
| 6,097,521 A | 8/2000 | Althaus et al. | 398/139 |
| 6,103,398 A | 8/2000 | Norton et al. | |
| RE37,554 E | 2/2002 | Brunner et al. | 438/116 |

(Continued)

FOREIGN PATENT DOCUMENTS

DE   19535777   3/1997

(Continued)

OTHER PUBLICATIONS

Foreign Translation of JP 09-83018.*

(Continued)

*Primary Examiner*—Laura M Menz
(74) *Attorney, Agent, or Firm*—Fish & Richardson P.C.

(57) ABSTRACT

A method for producing a surface mounting optoelectronic component comprises the following steps: readying a base body with the optoelectronic transmitter and/or receiver arranged in a recess of the base body, filling the recess of the base body with a transparent, curable casting compound, and placing the optical device onto the base body, whereby the optical device comes into contact with the casting compound.

19 Claims, 4 Drawing Sheets

U.S. PATENT DOCUMENTS

| | | | |
|---|---|---|---|
| 6,440,877 B1 | 8/2002 | Yamazaki et al. | |
| 6,576,930 B2 * | 6/2003 | Reeh et al. | 257/98 |
| 6,610,563 B1 * | 8/2003 | Waitl et al. | 438/166 |
| 6,624,491 B2 * | 9/2003 | Waitl et al. | 257/434 |
| 6,635,955 B2 * | 10/2003 | Scheidle | 257/678 |
| 6,645,783 B1 * | 11/2003 | Brunner et al. | 438/26 |
| 6,653,564 B2 * | 11/2003 | Scheidle | 174/527 |
| 6,858,879 B2 * | 2/2005 | Waitl et al. | 257/99 |
| 6,946,714 B2 * | 9/2005 | Waitl et al. | 257/434 |
| 7,105,862 B2 * | 9/2006 | Waitl et al. | 257/99 |
| 7,138,301 B2 * | 11/2006 | Waitl et al. | 438/123 |
| 7,368,329 B2 * | 5/2008 | Waitl et al. | 438/125 |
| 2001/0002049 A1 * | 5/2001 | Reeh et al. | 257/103 |
| 2001/0022390 A1 * | 9/2001 | Waitl et al. | 257/666 |
| 2001/0030326 A1 * | 10/2001 | Reeh et al. | 257/98 |
| 2004/0104445 A1 * | 6/2004 | Waitl et al. | 257/434 |
| 2004/0201028 A1 * | 10/2004 | Waitl et al. | 257/99 |
| 2004/0232435 A1 * | 11/2004 | Hofer et al. | 257/99 |
| 2005/0110123 A1 * | 5/2005 | Waitl et al. | 257/678 |
| 2005/0127385 A1 * | 6/2005 | Reeh et al. | 257/98 |
| 2005/0161694 A1 * | 7/2005 | Reeh et al. | 257/100 |
| 2005/0231953 A1 * | 10/2005 | Reeh et al. | 362/260 |
| 2006/0022212 A1 * | 2/2006 | Waitl et al. | 257/98 |
| 2006/0138442 A1 * | 6/2006 | Waitl et al. | 257/99 |
| 2007/0034889 A1 * | 2/2007 | Waitl et al. | 257/99 |
| 2007/0269927 A1 * | 11/2007 | Hofer et al. | 438/106 |
| 2008/0173878 A1 * | 7/2008 | Waitl et al. | 257/81 |
| 2008/0210962 A1 * | 9/2008 | Blumel et al. | 257/98 |
| 2008/0265266 A1 * | 10/2008 | Bogner et al. | 257/98 |

FOREIGN PATENT DOCUMENTS

| | | |
|---|---|---|
| EP | 0 230 336 | 7/1987 |
| EP | 0 374 121 | 6/1990 |
| EP | 0 400 176 | 12/1990 |
| JP | 57-085273 | 5/1982 |
| JP | 60-020587 | 2/1985 |
| JP | 3-11771 | 1/1991 |
| JP | 4-109556 | 9/1992 |
| JP | 8-32120 | 2/1996 |
| JP | 09-027643 | 1/1997 |
| JP | 09027643 | 1/1997 |
| JP | 9-83018 | 3/1997 |
| JP | 09-83018 * | 3/1997 |
| JP | 09083018 | 3/1997 |
| JP | 0210606 | 7/1998 |
| WO | WO 82/04500 | 12/1982 |
| WO | WO 83/00408 | 2/1983 |
| WO | WO 01/06546 | 1/2001 |

OTHER PUBLICATIONS

English Translation of the Sanki JP 09-83018 reference provided by the Applicant and performed by Morningside Translations.*
Fonstad et al., PCT, Jan. 2001.
F. Mollmer, et al., "Siemens-SMT-TOP-LED—LEDs for Surface Mounting, Part I: Characteristics and special features", Siemens Components, Issue 26, No. 4/5, Oct. 1991, pp. 147-149 (German & English).
Order Granting Request for Ex Parte Reexamination for U.S. Appl. No. 90/008,083 dated Aug. 2, 2006.
Order Granting Request for Ex Parte Reexamination for U.S. Appl. No. 90/008,084 dated Aug. 2, 2006.
Office Action in Ex Parte Reexamination for U.S. Appl. No. 90/008,083 dated Jun. 30, 2008.
Office Action in Ex Parte Reexamination for U.S. Appl. No. 90/008,084 dated Jun. 30, 2008.
Japanese Examination Report for Japanese Patent Application No. 2000-539534 dated Sep. 2, 2008.

* cited by examiner

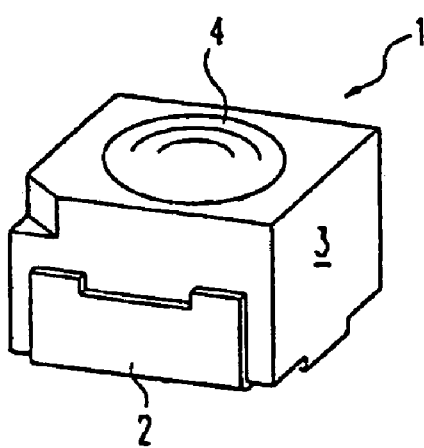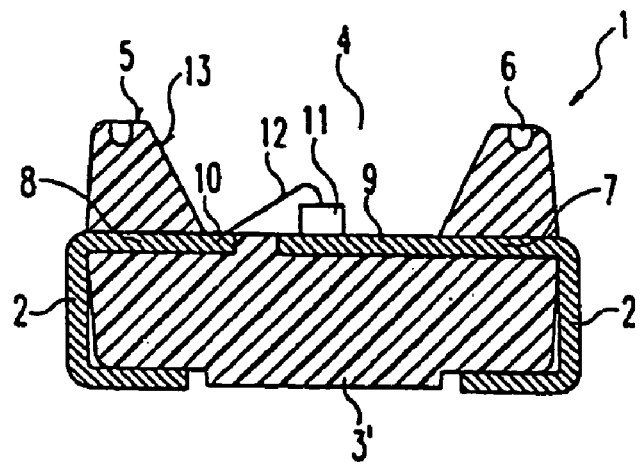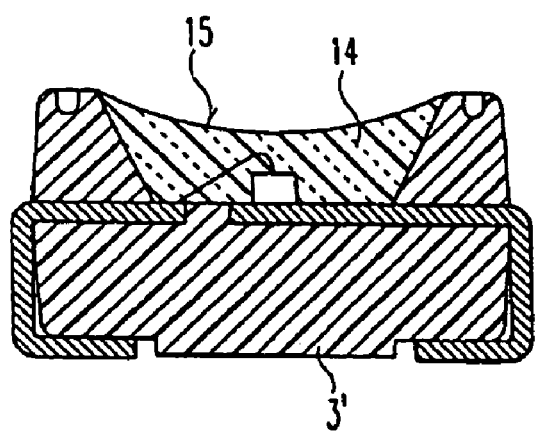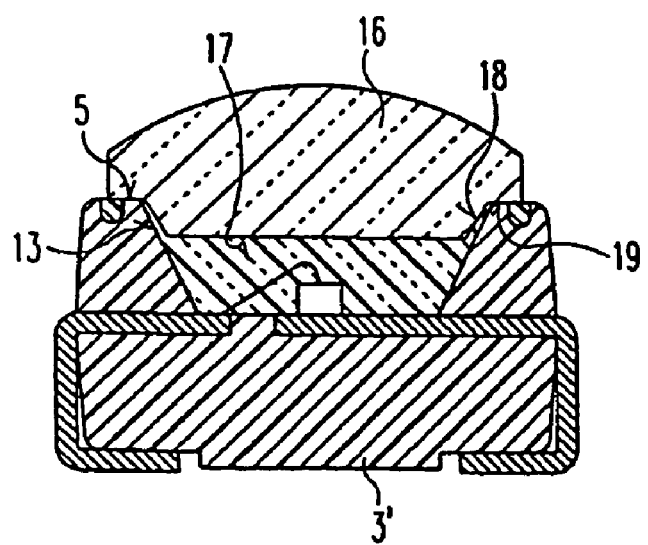

SURFACE MOUNTING OPTOELECTRONIC COMPONENT AND METHOD FOR PRODUCING SAME

CROSS-REFERENCE TO RELATED APPLICATIONS

This application is a continuation of application Ser. No. 10/439,695, filed May 16, 2003, now U.S. Pat. No. 6,946,714 which is a divisional of application Ser. No. 09/581,585, filed Oct. 5, 2000, now U.S. Pat. No. 6,610,563 which is the U.S. national stage application of PCT application PCT/DE98/03676, filed Dec. 15, 1998, which claims priority to DE 197 55 734, filed Dec. 15, 1997. The contents of the prior applications are hereby incorporated by reference.

BACKGROUND

The present invention relates to a method for producing a surface mounting optoelectronic component comprising a base body, an optoelectronic transmitter and/or receiver that is arranged in a recess of the base body, and an optical device that occludes the recess, as well as to a surface mounted optoelectronic component.

In recent years, surface mounting technology (SMT) has increasingly supplanted the equipping of conductor carriers with wired components. The crucial advantage of SMT is an increase in packing density, which cannot be achieved by conventional insertion methods.

Due to the high packing density, which is desirable in many optical applications, SMT is particularly important in the field of optoelectronics. There are already known optoelectronic components which are designed to be surface mounting in accordance with the SMT concept.

European Patent Application No. EP 0 230 336 A1 describes a surface mounting optoelectronic component that comprises an annular housing, the upper opening of which is sealed by a ball lens, while the lower opening of the ring stands on a printed circuit board. Inside the housing, a light-emitting semiconductor element is arranged between the circuit board and the bottom vertex of the ball lens. The interior space of the ring housing, which is defined by the surface of the printed board and the ball lens, is filled with a transparent glue.

Another surface mounting optoelectronic component is illustrated in European Patent Application No. EP 0 400 176. This component has a base body with a central depression in which an optically active semiconductor element is arranged. Above the base body, there is a lens, which is connected to the base body via a fixing mechanism such as a clamping peg.

"Siemens SMT-TOPLED für die Oberflächenmontage" (Frank Möllmer and Günter Waitl, Siemens Components 29 (1991), Vol. 4:147-149) teaches a light emitting diode (LED) which is provided for surface mounting. To produce this diode, a continuously stamped conductor strip is coated with a thermally stable thermoplast, forming the housing frame. In the inner region of the housing frame, an optically active element is mounted on the conductor strip and electrically contacted to interconnects there. Next, the frame's interior region for guarding the active element against environmental influences is cast using a casting resin. A lens or similar optical device is not provided in this component.

The SMT opto-components described in the documents cited above have the unique attribute that first the whole component housing is produced by coating a conductor strip with a thermoplast material, and the opto-electronic transmitter and/or receiver is inserted into the thermoplast housing only after this is produced. The advantages of this method of production are that a very economical mass production at the belt (conductor strip) is possible, and low structural heights and standardized basic structural forms are easy to realize. Due to their low costs, these prehoused SMT opto-components, as they are called, are used above all in display arrays and the like.

SUMMARY

It is the object of the present invention to set forth a method by which the emission characteristic of opto-electronic SMT components of the above type can be improved without raising the component costs unacceptably. The present invention is also directed to designing this type of optoelectronic SMT component with a well definable emission characteristic and simultaneously low component costs.

This object is achieved in accordance with the present invention in a method for producing a surface mounting optoelectronic component having a base body, an optoelectronic transmitter/receiver that is arranged in a recess of the base body, and an optical device that covers the recess, said method comprising the steps of: preparing the base body with the optoelectronic transmitter/receiver arranged in the recess; filling the recess of the prepared base body with a transparent hardenable casting compound; then placing the optical device onto the as yet uncured casting compound; and then curing the casting compound.

This object is also achieved in accordance with the present invention in a surface mounting optoelectronic component comprising: a base body having a thermoplast injection housing and a coated conductor strip secured to the housing, said base body having a recess formed therein with a portion of the conductor strip situated inside the recess; an optoelectronic transmitter/receiver arranged in the a recess of the base body and mounted on the portion of the conductor strip situated inside the recess; a transparent hardenable casting compound provided in the recess, said casting compound having thermal characteristics adapted to those of the thermoplast housing material; and an optical device covering the recess and cast onto the casting compound such that a seating surface of the optical device is in surface-wide contact with the casting compound.

In an embodiment of the invention, the step of preparing the base body may comprise: coating a conductor strip with a thermoplast housing while simultaneously forming the recess of the base body into a top surface of the thermoplast housing, a portion of said conductor strip being situated inside the recess; mounting the optoelectronic transmitter/receiver on said portion of the conductor strip situated inside the recess; and filling the recess of the base body with a transparent curable casting compound having thermal characteristics adapted to the thermoplast housing material.

In an embodiment, the recess of the base body may be filled with the casting compound to a level such that, during the subsequent placement of the optical device, essentially no casting compound runs over an edge of the recess.

In an embodiment, the recess may be filled with casting compound essentially to the edge of the recess such that, after the recess is filled with casting compound, a fillet develops owing to the surface tension of the casting compound; and the optical device has a shape in a region contacting the casting compound that no casting compound runs over the edge of the recess when the optical device is subsequently placed onto the casting compound.

In an embodiment, the optical device may be placed from above, without pressure, onto one of the base body or at least one seating element attached to said base body within said recess.

In an embodiment, the casting compound may be cured by the influence of heat.

In an embodiment, prior to filling the recess, an optical device may be produced by one of casting, pressing, or injection processing; then the optical device may be readied and transported as bulk material of optical devices; then a respective optical device may be automatically picked from the bulk material; and then the picked optical device may be automatically positioned over the base body.

An embodiment provides for a method for producing a surface mounting optoelectronic component having a base body, an optoelectronic transmitter/receiver that may be arranged in a recess of the base body, and an optical device that covers the recess, the method comprising: preparing the base body with the optoelectronic transmitter/receiver arranged in the recess; then filling the recess of the prepared base body with a first transparent hardenable casting compound; then readying a casting mold half and filling the mold half with a second transparent hardenable casting compound; then at least partially curing at least one of the first casting compound in the recess of the base body and the second casting compound in the mold half; then casting the optical device onto the base body by joining the base body and the mold half properly positioned, such that second casting compound in the mold half comes into contact with a surface of the first casting compound in the recess of the base body; then curing at least one of the second and first casting compound; and then removing the mold half from the base body with the cast-on optical device.

In an embodiment, the method may further comprise, prior to joining the base body and the mold half, wetting the surface of the first casting compound.

In an embodiment, the step of wetting the surface of the first casting compound may comprise: turning the base body about a horizontal axis such that an opening of the recess is directed downwardly; and at least superficially immersing the base body in liquid casting compound.

In an embodiment, the at least partial curing of the first casting compound may be by heat treatment.

In an embodiment, the at least partial curing of the second casting compound may be by heat treatment.

In an embodiment, the method may further comprise: leading a number of base bodies on a first strip; and leading a number of mold halves on a second strip, wherein the first strip and the second strip may be led in parallel at least during the step of casting the optical device onto the base body.

In an embodiment, the method may further comprise: leading a number of base bodies on a first strip; combining a number of mold halves in a group; and connecting the group of mold halves, such that they can be detached, to a corresponding number of base bodies at least during the step of casting the optical device onto the base body.

In an embodiment, the base body and the mold half may be joined at a temperature of approximately 80° C.

In an embodiment, the second casting compound may be cured at a temperature of approximately 150° C.

In an embodiment, the mold half may be removed from the base body at a temperature of approximately 80° C.

In an embodiment, the recess may comprise a ring channel surrounding the recess.

In an embodiment, the base body may comprise a number of seating elements for seating of the optical device, the seating elements being arranged at a margin side relative to the recess.

These embodiments are described in more detail below.

Following the production of the base body with the optoelectronic transmitter and/or receiver arranged in the recess, the recess of the base body is filled with a transparent hardenable casting compound, and the optical device is attached to the base body, said optical device being brought into contact with the casting compound in the region of the recess before the casting compound and/or the optical device (if this also comprises a casting compound) has completely hardened.

An aspect of a preferred embodiment is that the optical device may be placed on the base body only after the recess is poured with casting compound. Because the optical device is placed onto the recess when the latter is already filled with casting compound, the optical device can be positioned on the base body extremely precisely and reproducibly, and this positioning remains essentially unaffected by subsequent steps such as curing or removal from the mold. This guarantees a high optical quality of the optoelectronic component with respect to the emission behavior or reception behavior, which is very important for applications in which an exact beam guidance and a high light yield are desirable. The inventive optoelectronic components are thus superior to components in which the recess is filled from the reverse side given a previously mounted optical device.

The inventive method can be applied particularly advantageously in the production of what are known as prehoused optoelectronic components. Here, the base body is produced first by coating a conductor strip with a thermoplast while the housing with the recess is simultaneously formed, and then the optoelectronic transmitter and/or receiver is assembled on a section of the conductor strip that resides in the recess.

In accordance with a first, particularly advantageous embodiment of the inventive method, the optical device is placed on the as yet unhardened casting compound, and the casting compound is then cured.

In this case, the fill level of the casting compound can be selected such that casting compound does not escape over the edge of the recess when the optical device is placed on. It is then unnecessary to take measures to trap casting compound that may overflow.

It is also possible to exploit a fillet formation of the casting compound, which arises on the basis of its surface tension. In this case, an optical device is used whose shape in its region that contacts the casting compound is selected such that, even when the recess is filled to the edge with casting compound, said casting compound does not overflow the edge of the recess when the optical device is placed on.

The base body can also be provided with a ring channel that surrounds the recess before the optical device is placed on. In this case, casting compound that may overflow when the optical device is placed on is collected in the ring channel, thus preventing it from running down on the exterior of the base body and hardening there, which would impair the manipulability of the component.

A particularly reproducible positioning of the optical device is achieved when, prior to the placement of the optical device, the base body is provided with seating elements that are arranged at the margin side relative to the recess. The seating elements can be formed integrated with the housing in the above described injection step for producing the base body for a prehoused optoelectronic component.

Preferably, the optical device is placed from above onto the base body, or the seating elements that have been fashioned thereon, without pressure. The placement of the optical device then occurs by means of gravity alone.

In an embodiment, the optical device is first produced by means of a casting, pressing or injection procedure before the optical device is placed on, and then it is transported in bulk and placed onto a base body by automatic picking from the bulk material and automatic positioning over said base body. The advantage of these measures is that the optical device is produced completely independently of the production of the base body, opening up the possibility to control the quality of the optical device effectively and distinctly and to eliminate spoilage. This makes it possible to produce components of the highest quality.

In a second particularly preferred embodiment of the inventive method, the optical device is formed in a casting process, and in the scope of this casting process it is placed onto the base body in the region of the recess and is cast out with the casting compound in the recess. Also, in this second embodiment of the inventive method, the recess of the base body is filled before the optical device is placed on in the scope of said pouring process, so that the advantages associated with this procedure are also manifest in this embodiment of the invention.

In this second embodiment of the inventive method for producing the optical device, one half of a casting mold is advantageously prepared first, and this half is filled with an additional casting compound. On the other hand, when the recess of the base body has been filled with casting compound, the casting compound is first hardened at least partially and is then wetted with casting compound. Next, the base body and the half of the casting mold which is filled with the additional casting compound are joined, under correct positioning, and in a following step the additional casting compound in the casting mold half is cured, whereby it is cast onto the casting compound in the recess of the base body. Lastly, the now finished optoelectronic component is ejected by removing the half of the casting mold from the base body with the optical device that has been cast on.

Wetting can be accomplished by turning the base body about a horizontal axis and immersing it in casting compound at least on the surface, for example. Because of the at least partial hardening of the casting compound, none of the compound escapes during the turning process.

The wetting of the surface of the casting compound prevents air bubbles from remaining in the casting compound in the subsequent casting on process.

An advantage of the described second embodiment of the inventive method is that it is particularly easy to realize and has a high potential for automation, enabling mass production on an industrial scale.

Other aspects, embodiments, and advantages follow.

DESCRIPTION OF DRAWINGS

FIG. 1 is a perspective view of a base body with housing and conductor strip as used in the inventive method;

FIGS. 2A, 2B, and 2C show the steps of preparing the base body, filling the recess of the base body, and placing the optical device onto the base body in accordance with a first embodiment of the present invention using the example of the base body illustrated in FIG. 1;

Like reference symbols in the various drawings indicate like elements.

DETAILED DESCRIPTION

Figure 3:
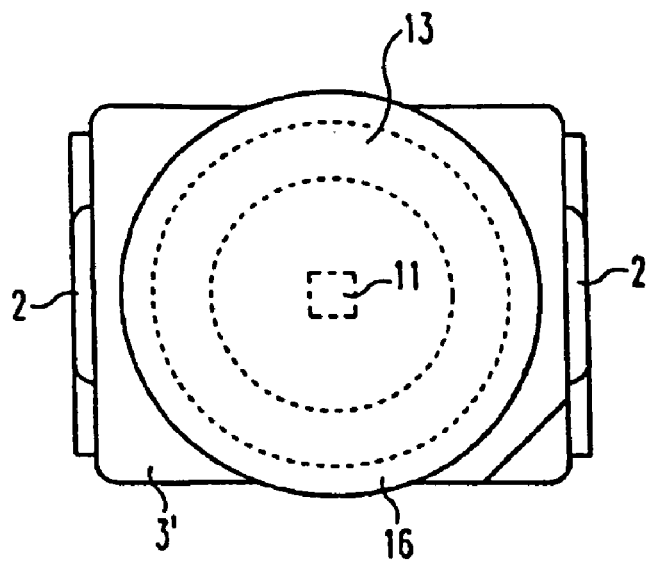
FIG. 3 illustrates the optoelectronic component represented in FIG. 2C, as produced in accordance with the first inventive embodiment, in a plan view.

FIG. 1 shows a base body 1, which is formed by coating a conductor strip 2 with a high-temperature thermoplast housing 3. The housing 3 advantageously has flat exterior surfaces, guaranteeing easy insertion. At the surface, a recess 4 is provided in the housing 3.

FIG. 2A shows a sectional illustration of a base body 1 that is constructed essentially in accordance with FIG. 1, the housing 3' differing from the housing 3 illustrated in FIG. 1 only to the extent that the surface 5 of the housing 3' is provided with a ring groove 6 that surrounds the recess 4, which will be mentioned later. FIG. 2A shows that sections 7,8 of the conductor strip 2 are surrounded by the thermoplast housing 3' and protrude with contact portions 9,10 into the recess 4 in the bottom region of said recess 4. A contact portion 9 is extended up to the central region of the recess 4.

The inner wall surfaces 13 of the housing 3 are constructed as oblique surfaces and form a reflector. By selecting a housing material with a high diffuse degree of reflection of approximately 90% or more, a high reflectivity of these surfaces 13 is generated.

Following the production of the conductor strip housing structure 2,3', a semiconductor chip 11 is mounted in the recess 4 of the housing 3'. In the representation in FIG. 2A, this assembly step has already been performed. The semiconductor chip 11 is placed onto the extended contact portion 9 of the conductor strip 2 and electrically contacted to this. An additional electrical contacting occurs via a wire 12, which is led from the semiconductor chip 11 to the opposite contact portion 10 of the conductor strip 2. As semiconductor chip 11, a light-emitting diode or a photosensitive semiconductor element can be used, for example.

Following the assembly and contacting of the semiconductor chip 11, the recess 4 is filled with a free-flowing casting compound 14 in accordance with the illustration in FIG. 2B. The casting compound 14 can be a matter of an epoxy resin, for example. The casting compound 14 and the housing 3' material are matched with respect to thermal properties in order to prevent thermal loads, such as may arise in the soldering of the component and in later use, from causing mechanical failures.

Due to the surface tension of the casting compound 14, its surface 15 is fashioned in the shape of a fillet; that is, it has a concave course.

The fill level of the casting compound 14 depends on the dimension of the fillet formation, the shape of the optical device that is placed onto the recess 4 in the next step (see FIG. 2C), and also on whether measures have been taken at the housing to trap casting compound 14 that may overflow the edge, such as the surrounding ring groove 6 that is illustrated here.

FIG. 2C illustrates the subsequent placement of an optical device onto the recess 4. In the example illustrated in FIG. 2C, the optical device is realized in the form of a plane-convex convergent lens 16. On the side facing the recess 4, in the center region the convergent lens 16 has a flat base surface 17, which continues via a lead-in slope into a radially outlying annular seating surface 19. The base surface 17 is coplanar with the seating surface 19.

In the placing of the lens 16 onto the housing 3, which has been filled with casting compound in accordance with FIG. 2B, the lens 16 is first positioned over the recess 4 and aligned with it axially. Next, the lens 16 is lowered onto the thermoplast housing 3', whereby the lead-in slope 18 of the lens 16 and a top region of the inclined surface 13 of the inner wall of the reflector interact for self-centering. As a result, the achieved end position of the lens 16 relative to the housing 3' is largely independent of the preceding alignment step and is determined essentially by the dimensional stability of the lens 16 and housing 3' production in the corresponding regions of the slope surface.

The lens 16 is placed on the housing 3' as follows: First, the lens's base surface 17 is brought into contact with the surface 15 of the casting compound 14. At this time, the seating surface 19 is not yet seated on the surface 5 of the housing 3'. The subsequent lowering of the lens 16 into the final position can be effectuated by the influence of gravity alone. This entails a surface-wide contact of the base surface 17 of the lens with casting compound 14 and, depending on the fill level of the recess 4 (FIG. 2B), a displacing of casting compound 14 from the recess 4. Casting compound 14 that overflows the edge of the housing collects in the ring groove 6. The ring groove 6 thus prevents casting compound from flowing out down the housing's 3' outer wall, which would otherwise be possible. A certain overflow of casting compound into the ring groove 6 can thus be thoroughly desirable, since this favorably affects the closeness of the joint between the lens 16 and the housing 3'.

In a final step of production, the casting compound 14 is hardened in the component, for instance in the scope of a heat treatment.

FIG. 3 shows a plan view of the optoelectronic component illustrated in FIG. 2C. The oblique surfaces 13 of the wall of the recess 4 that form the reflector, and the semiconductor chip 11, are located under the lens 16 and are represented by broken lines. The optional ring groove 6 is not included in the illustration for reasons of simplicity.

The method detailed with the aid of FIGS. 2A to 2C can be carried out using lenses of various types and materials. It is essential, however, that in this embodiment of the inventive method the production of the lenses is already concluded before they are placed on the housing 3, 3'.

Figure 4:
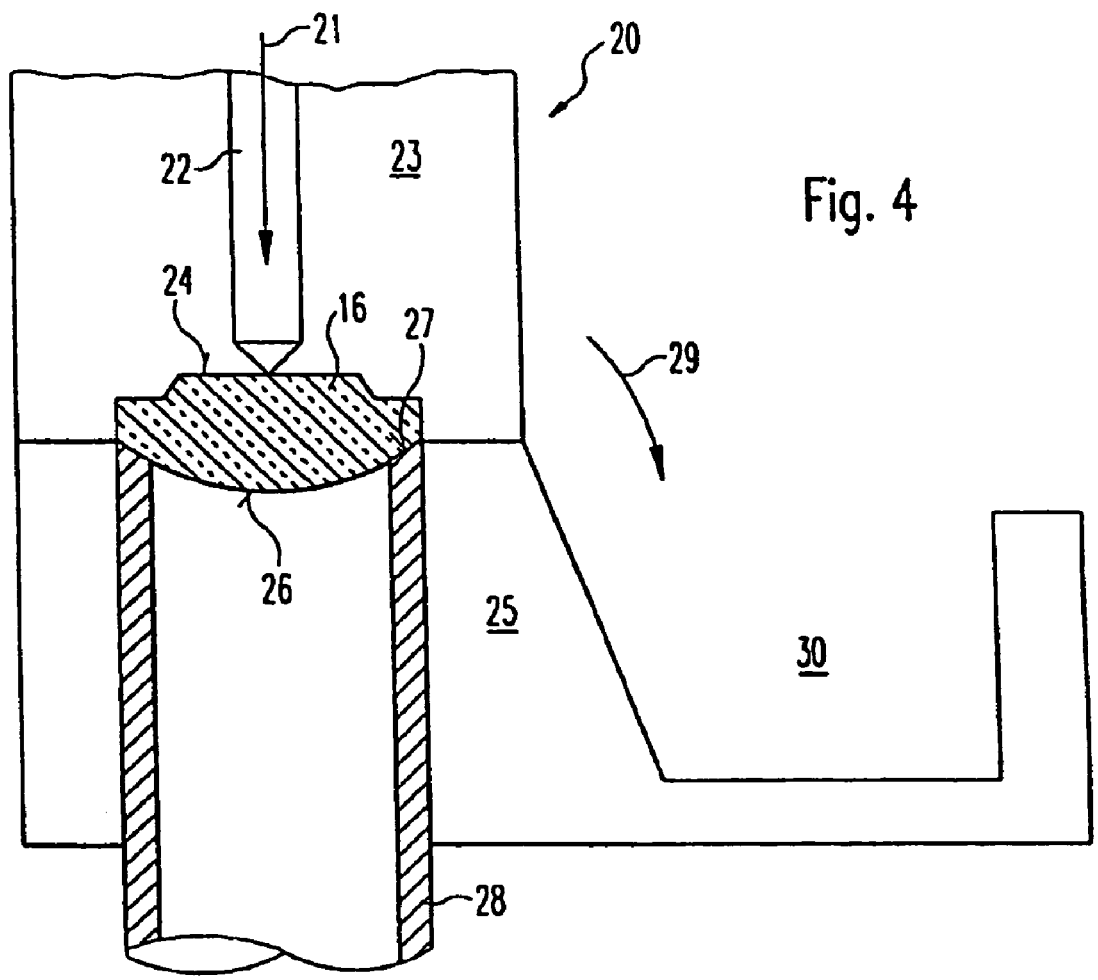
FIG. 4 is a schematic view explicating the production and transport of the optical device.

FIG. 4 details an example of the production of the plane-convex convergent lens 16 illustrated in FIG. 2C by a transfer molding process that is carried out in a press tool 20. In this process, clear pressing compound is first pressed in the direction of the arrow 21 through a channel 22 of a heated half 23 of the tool into a press mold which is defined by a mold surface 24 of the first half of the tool, a mold surface 26 of a second half 25 of the tool, which is situated adjacent the first half 23, and to the face surface 27 of a ring ejector 28 that has been displaceably accepted in the second tool half 25. The pressing compound is then formed by a pressing process into the lens 16, which is then pushed out of the press tool 20 by means of the ring ejector 28 in the direction of the arrow 29 in a hot state with a stable form. The lens 16 then drops into a lens collection container 30 as bulk material. The lens collection container 30 is connected to transport mechanisms, such as a shaker conveyor, funnels, and so on (which are not illustrated), via which the lens 16 is moved to an assembly unit (also not illustrated), by means of which it is placed on the housing 3 of the optoelectronic component in the described manner (see FIG. 2C).

In the lens production method described in accordance with FIG. 4, it has proven advantageous that only very low tolerances arise. As a result, on one hand, the spoilage is minimized, and on the other hand, the dimensional stability of the lens 16 favorably affects both the optical characteristics of the lens 16 and the reproducibility of the final position of the lens 16 in the housing 3, 3'.

Figure 5:
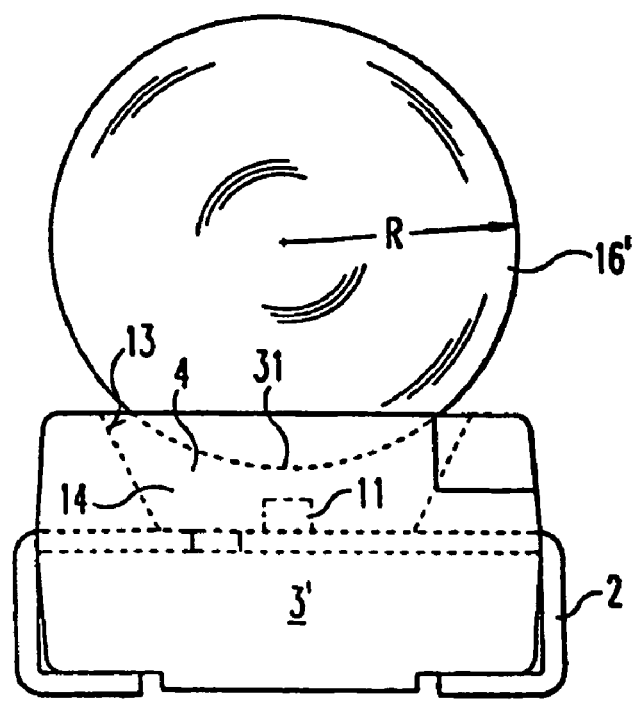
FIG. 5 illustrates another optoelectronic component which is produced in accordance with the first embodiment of the inventive method.

A modification of the optoelectronic component illustrated in FIG. 2C is shown in FIG. 5. The component in FIG. 5 differs from that in FIG. 2C essentially in having a ball lens 16' of diameter R instead of the plane-convex lens 16.

The component illustrated in FIG. 5 is produced by a method analogous to the steps represented in FIG. 2A to FIG. 2C. The self-centering of the ball lens 16 during placement onto the housing 3' is effectuated by its surface curvature. During placement of the lens 16', the ball portion 31 that protrudes into the recess 4 comes into contact with the casting compound 14. By selecting the fill level and/or the radius R of the lens 16' appropriately, a precise correlation can be achieved between the course of the surface of the ball portion 31 in its inserted state and the convex course of the casting compound surface 15. In this case, in essence no casting compound is displaced during placement of the lens 16'. An additional advantage of the rounded ball portion 31 is that it guarantees that air bubbles cannot remain between the casting compound surface 15 and the lens 16' in the assembly process.

Figure 6:
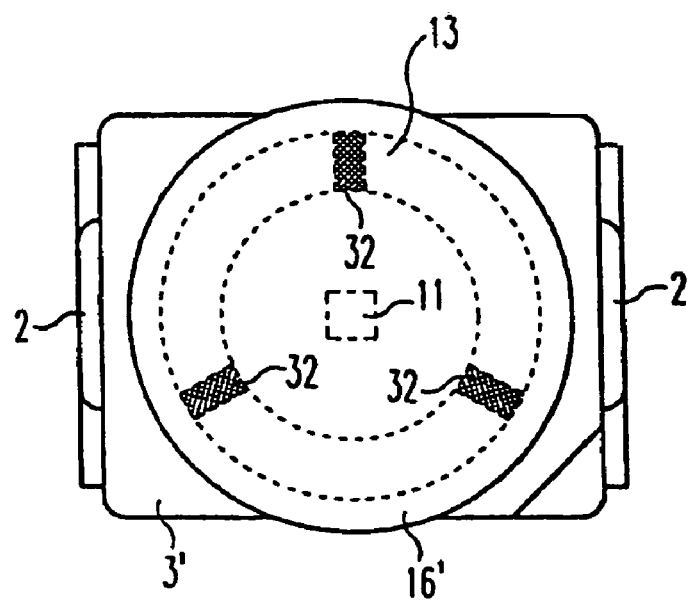
FIG. 6 is a plan view of the optoelectronic component illustrated in FIG. 5.

FIG. 6 shows a plan view of the component illustrated in FIG. 5 with ball lens 16'. This FIG. 6 shows that radial ridges are fashioned on the oblique inner wall surfaces 13 of the recess 4, which serve as seating surfaces for the ball lens 16'.

On one hand, the radial ridges 32 bring about a definite and stable three-point seating of the ball lens 16', which further enhances the reproducibility of the installation position of the ball lens 16' relative to the housing 3'. On the other hand, the radial ridges 32 create an annulus type free area between the inner surface 13 of the recess 4 and the ball portion 31, which area can serve as an accepting volume for displaced casting compound 14, so that the casting compound 14 can be prevented from overflowing the edge of the recess even in case of a marked displacement of casting compound.

Radial ridges 32 or similar seating elements can also be provided given other lens shapes, and particularly given the plane-convex lens 16 used in accordance with FIG. 2C.

Figure 7:
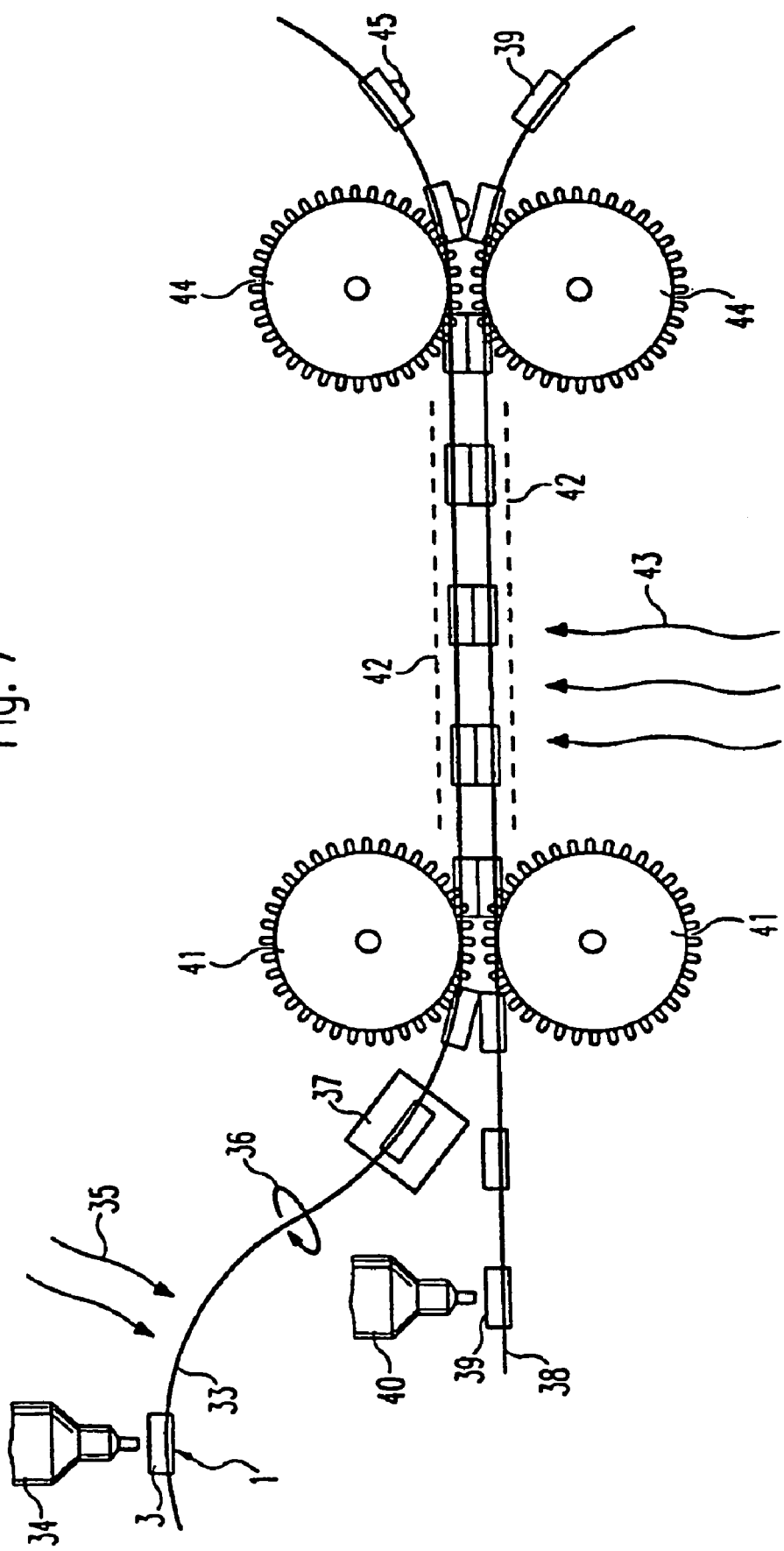
FIG. 7 is a schematic representation explicating a second embodiment of the inventive method.

FIG. 7 details a second embodiment of the inventive method. The main difference between the two embodiments is that in the second embodiment the optical device is attached to the component housing 3 in a casting process.

Housings 3 that have been provided with an optical semiconductor chip 11 (see FIG. 1) are fed on a first strip 33 to a casting station 34, in which the recess 4 of the component housing 3 is cast. Next, a curing or at least partial curing of the casting compound is carried out by thermal effects 35. At 36 the strip 33 is turned 180°, and at 37 the cast surface of the housing, now directed downward, is immersed in casting resin for prewetting same.

The wetting of the hardened or cured-on casting compound can also be accomplished some other way. The wetting guarantees that the subsequent casting process ensues without air bubbles.

A second strip 38 carries casting mold halves 39 which are provided for producing the optical device. To this end, the mold halves 39 are filled with a casting resin in a lens casting station 40. The first strip 33 with the housings 3 facing down, and the second strip 38 with the filled casting mold halves 39, are led together through the gap between two hedgehog wheels 41, which are arranged axis-parallel, and are merged in the gap. The hedgehog wheels 41 are heated, so that a temperature of approx. 80° C. prevails in the gap. After leaving the gap, the combination housing/mold halves 3, 39 undergoes heat treatment 43 at aprox. 150° C. under the influence of a mechanical guidance 42. The effect of the heat treatment is that casting material that is respectively present in the casting mold halves 39 is poured onto the surface of the casting compound at the housing side and cures onto this surface. The two strips 33, 38 traverse the gap of a second pair of hedgehog wheels 44, which is likewise kept at a temperature of 80° C. The ejection of the component with the cast-on optical device 45 from the mold is accomplished at the output side of the second pair of hedgehog wheels 44 by diverging the two strips 33 and 38.

The method illustrated in FIG. 7 can be modified as follows:

Instead of on a strip, a predetermined number of n casting mold halves can be combined integrally in a pallet type group of casting molds. Following a corresponding pretreatment in accordance with FIG. 7, the group of casting molds which are filled with casting compound are led to the strip 33 from below such that each mold half of the group comes into contact with a housing 3 that is arranged on the strip 33. They can be held together by clamping, for instance. The strip 33 with the clamped-on casting mold group then undergoes a heat treatment 43 at approx. 150° C. similarly to the double strip structure in FIG. 7. Following successful curing, the entire casting mold group is removed from the strip 33 in the scope of the ejection process.

The latter method employing a casting mold group has the advantage over the double-strip method illustrated in FIG. 7 that the casting mold groups that are used can be reused some 200 to 300 times, while the casting mold halves 39 that are conveyed on the strip 38 generally must be replaced after a few usages. Besides this, greater positioning accuracy is achieved by the integral design and thus stable arrangement of the casting molds in the group, so that the optoelectronic components that are produced by this method generally satisfy higher quality requirements.

On the other hand, the double-strip method illustrated in FIG. 7 has the advantage that it can be carried out very cost-effectively due to the high degree of automation.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. For the sake of brevity, conventional elements may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention. The details of one or more embodiments of the invention are set forth in the accompanying drawings and the description below.

Other features, objects, and advantages of the invention will be apparent from the description and drawings, and from the claims.

What is claimed is:

1. A surface mounting optoelectronic component comprising:
    a base body having a recess therein;
    an optoelectronic semiconductor chip arranged in the recess of the base body;
    a first casting compound, wherein the first casting compound at least partially covers the optoelectronic semiconductor chip and wherein the casting compound is configured to pass electromagnetic radiation emitted or detected by the optoelectronic semiconductor chip; and
    an optical device, wherein a surface of the optical device is in contact with a surface of the first casting compound, and wherein the shape of the surface of the first casting compound is determined by the shape of the surface of the optical device,
    wherein the optical device comprises on the side facing the recess a protruding base surface in a center region, the optical device continues via a lead-in slope into a radially outlying annular seating surface.

2. The surface mounting optoelectronic component as claimed in claim 1, wherein the lead-in slope of the optical device and a top region of the inclined surface of the inner wall of the recess of the base body interact for self-centering.

3. The surface mounting optoelectronic component as claimed in claim 1, wherein the protruding base surface is a protruding flat base surface.

4. The surface mounting optoelectronic component as claimed in claim 1, wherein the base body comprises a ring channel surrounding the recess.

5. The surface mounting optoelectronic component as claimed in claim 4, wherein the flat base surface of the optical device is coplanar with the seating surface of the optical device.

6. The surface mounting optoelectronic component as claimed in claim 4, wherein the ring channel is at least partially filled with the first casting compound and the first casting compound promotes the closeness of the joint between the optical device and the base body.

7. The surface-mounting optoelectronic component as claimed in claim 1, wherein the first casting composition is cured, and the cured first casting compound promotes the adhesion between the base body and the optical device.

8. The surface mounting optoelectronic component as claimed in claim 1, wherein the base body comprises a number of seating elements for seating of the optical device, said seating elements being arranged at a margin side relative to the recess.

9. The surface mounting optoelectronic component as claimed in claim 1, wherein the recess of the base body comprises inner wall surfaces which are constructed as oblique surfaces and form a reflector.

10. The surface mounting optoelectronic component as claimed in claim 9, wherein the base body is composed of a housing material with a high diffuse degree of reflection.

11. The surface mounting optoelectronic component as claimed in claim 1, wherein the optical device is realized in the form of a plane-convex lens.

12. The surface mounting optoelectronic component as claimed in claim 1, wherein the protruding base surface is in surface wide contact with the first casting compound.

13. The surface mounting optoelectronic component as claimed in claim 1, wherein the first casting compound has thermal characteristics adapted to those of the material of the base body.

14. The surface mounting optoelectronic component as claimed in claim 1, wherein the optical device is composed of a second casting compound.

15. The surface mounting optoelectronic component as claimed in claim 14, wherein the second casting compound is at least partially cured before being placed onto the first casting compound.

16. The surface mounting optoelectronic component as claimed in claim 1, wherein part of the optical device is located in the recess.

17. The surface mounting optoelectronic component as claimed in claim 1, wherein the first casting composition is hardened after the optical device is placed on the first casting composition to cause the shape of the surface of the first casting compound to be determined by the shape of the surface of the optical device.

18. The surface mounting optoelectronic component as claimed in claim 1, wherein the first casting composition comprises epoxy resin.

19. The surface mounting optoelectronic component as claimed in claim 1, wherein the base surface extends into the recess, wherein the lead-in slope is on the side of the optical device facing the recess and surrounds the protruding base surface, and wherein the radially outlying annular seating surface of the optical device rests on the base body outside the recess.

* * * * *